United States Patent
Teraguchi

[11] Patent Number: 6,043,514
[45] Date of Patent: Mar. 28, 2000

[54] GROUP III-V TYPE NITRIDE SEMICONDUCTOR DEVICE

[75] Inventor: Nobuaki Teraguchi, Nara, Japan

[73] Assignee: Sharp Kabushiki Kaisha, Osaka, Japan

[21] Appl. No.: 09/022,642

[22] Filed: Feb. 12, 1998

[30] Foreign Application Priority Data

Feb. 27, 1997 [JP] Japan .................................. 9-043179

[51] Int. Cl.[7] .................................................. H01L 33/00
[52] U.S. Cl. .................................. 257/94; 257/76; 257/97
[58] Field of Search ............................ 257/94, 96

[56] References Cited

U.S. PATENT DOCUMENTS

| 5,530,267 | 6/1996 | Brandle, Jr. et al. | 257/76 |
| 5,625,202 | 4/1997 | Chai | 257/94 |
| 5,716,450 | 2/1998 | Togawa et al. | 117/101 |

FOREIGN PATENT DOCUMENTS

| 05029653 | 2/1993 | Japan | H01L 33/00 |
| 05275745 | 10/1993 | Japan | H01L 33/00 |

OTHER PUBLICATIONS

Nicholls et al., "Growth and Optical Properties of GaN Grown by MBE on Novel Lattice–Matched Oxide Substrates", *Mat. Res, Soc. Symp. Proc.* (1996) 395:535–539.

Nakamura et al., "InGaN Multi–Quantum–Well Structure Laser Diodes Grown on $MgAl_2O_4$ Substrates", *Appl. Phys. Lett.* (Apr. 1996) 15(68):2105–2107.

*Primary Examiner*—Olik Chaudhuri
*Assistant Examiner*—Douglas A. Wille
*Attorney, Agent, or Firm*—Morrison & Foerster LLP

[57] ABSTRACT

A group III–V type nitride semiconductor device includes a substrate with a crystal structure of rutile type, $CaC_2$ type, rock salt type, spinel type, $NaFeO_2(II)$ type or $LiAlO_2(I)$ type, and a nitride semiconductor layer epitaxially grown thereon. The substrate is selected so that its lattice constant allows good lattice match with respect to the nitride semiconductor layer, or the substrate is adjusted in composition to have such a lattice constant.

7 Claims, 11 Drawing Sheets

GROUP III-V TYPE NITRIDE SEMICONDUCTOR DEVICE

BACKGROUND OF THE INVENTION

1. Field of the Invention

The present invention relates to a group III–V type nitride semiconductor device, and particularly to reduction of lattice mismatch between a substrate material and a nitride semiconductor formed thereon.

2. Description of the Related Art

The typical substrate material for group III–V type nitride semiconductor devices conventionally includes $Al_2O_3$, SiC and the like. Recently, an attempt has been made to use $LiAlO_2$ and $LiGaO_2$ as substrate materials for epitaxial growth of a nitride semiconductor layer, as described in "GROWTH AND OPTICAL PROPERTIES OF GaN GROWN BY MBE ON NOVEL LATTICE-MATCHED OXIDE SUBSTRATES", J. F. H. Nicholls et al., Mat. Res. Soc. Symp. Proc., Vol. 395, 1996, Materials Research Society, pp. 535–539. Furthermore, an attempt has been made to use $MgAl_2O_4$ as a substrate material, as described in "InGaN Multi-quantum-well structure laser diodes grown on $MgAl_2O_4$ substrates", S. Nakamura et al., Appl. Phys. Lett., 68 (1996) pp. 2105–2107.

When $Al_2O_3$ is used as a substrate material, however, the lattice mismatch between e.g. GaN and the substrate reaches as high as at least 10%. When a substrate of SiC is used, GaN and AlN cause lattice mismatches of 3.5% and 1.0% with respect to the substrate, respectively. It is thus difficult to epitaxially grow a satisfactory single-crystal nitride semiconductor layer on a conventional $Al_2O_3$ or SiC substrate.

Meanwhile, it is said that the lattice mismatches of $LiAlO_2$ and $LiGaO_2$ with respect to GaN are −1.45% and 0.19%, respectively. $LiAlO_2$ has a crystal structure belonging to hexagonal system, and $LiGaO_2$ has a crystal structure belonging to rhombohedral system similar to hexagonal system. However, the actual crystals of $LiAlO_2$ and $LiGaO_2$ have a locally distorted structure.

Figure 21:
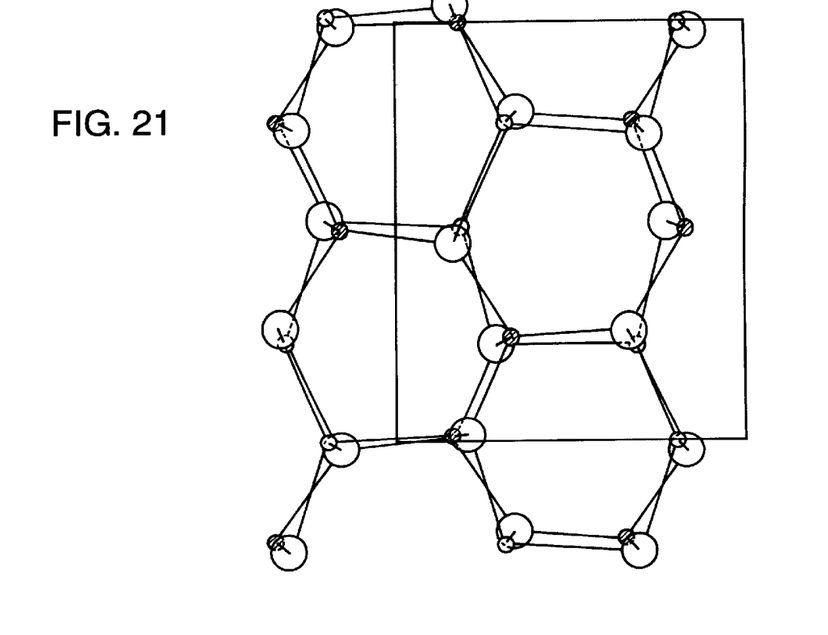
FIG. 21 is a diagram schematically showing a crystal structure of LiAlO$_2$ type.
Figure 22:
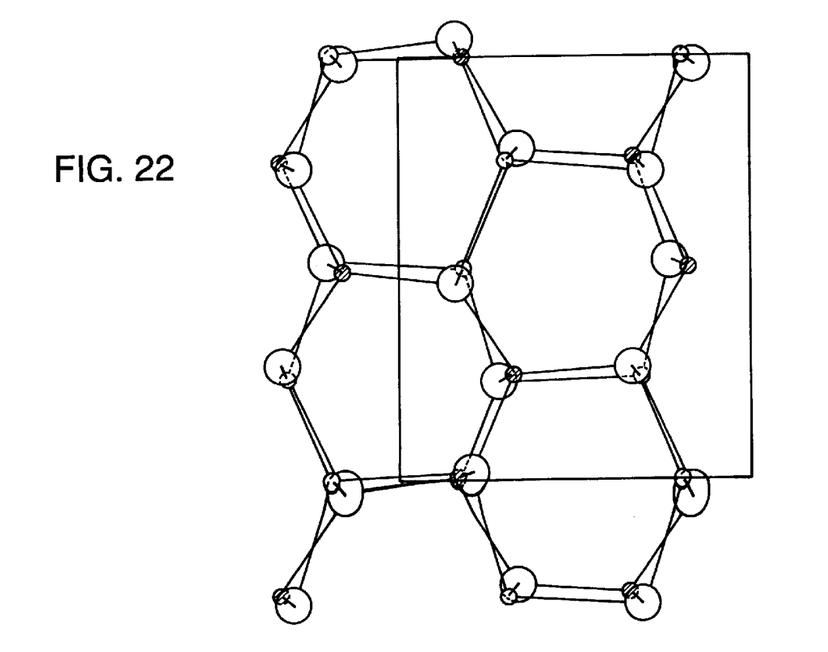
FIG. 22 is a diagram showing a crystal structure of NaFeO$_2$(II) type.

FIG. 21 shows a crystal structure of $LiAlO_2$, and FIG. 22 shows that of $NaFeO_2$. In the both of FIGS. 21 and 22, a larger white circle represents an oxygen atom and a smaller white circle represents a Li atom. A hatched circle in FIG. 21 represents an Al atom, and a hatched circle in FIG. 22 represents a Ga atom. As shown in FIGS. 21 and 22, the lattice sites of oxygen atoms form a shape distorted from an equilateral triangle.

The lattice constants of $LiAlO_2$ and $LiGaO_2$ corresponding to a lattice constant of hexagonal crystal of GaN is the distance between oxygen atoms. Tables 1 and 2 shows respective distances between oxygen atoms for $LiAlO_2$ and $LiGaO_2$, respectively. As can be seen from these tables, there are different distances between oxygen atoms in $LiAlO_2$ and $LiGaO_2$. Thus, it cannot be said that $LiAlO_2$ and $LiGaO_2$ are ideal substrate materials for GaN.

TABLE 1

| | O-O Bonded with Al | O-O Bonded with Li |
|---|---|---|
| Atomic Distance (Å) | 2.918 ± 0.004 | 3.301 ± 0.005 |
| | 2.896 ± 0.005 | 3.296 ± 0.003 |
| | 2.737 ± 0.003 | 3.430 ± 0.005 |
| | 2.874 ± 0.004 | 2.737 ± 0.003 |

TABLE 2

| | O-O Bonded with Ga | O-O Bonded with Li |
|---|---|---|
| Atomic Distance (Å) | 3.012 ± 0.006 | 3.189 ± 0.006 |
| | 3.050 ± 0.003 | 3.050 ± 0.004 |
| | 3.032 ± 0.005 | 3.182 ± 0.005 |
| | 3.004 ± 0.006 | 3.251 ± 0.006 |
| | 2.980 ± 0.004 | 3.222 ± 0.004 |
| | 3.021 ± 0.005 | 3.360 ± 0.005 |
| Average Distance (Å) | 3.016 ± 0.005 | 3.209 ± 0.005 |

It cannot be said either that $MgAl_2O_4$ substrate is an ideal substrate for GaN, since it causes a lattice mismatch of 11% with respect to GaN.

SUMMARY OF THE INVENTION

An object of the present invention is to find a substrate material satisfactorily lattice-matched to a nitride semiconductor and improve the characteristics of a group III–V type nitride semiconductor device with use of such a substrate.

A group III–V type nitride semiconductor device according to one embodiment of the present invention is characterized in that it includes a substrate containing an oxide having rutile structure, and a nitride semiconductor layer epitaxially grown on the substrate, and that the oxide substrate contains one selected from the group consisting of $CrO_2$, $GeO_2$ and $IrO_2$ and one selected from the group consisting of $MoO_2$, $NbO_2$, $OsO_2$, $RuO_2$, $TiO_2$ and $WO_2$.

A group III–V type nitride semiconductor device according to another embodiment of the present invention is characterized in that it includes a substrate containing an oxide having calcium carbide structure, and a nitride semiconductor layer epitaxially grown on the substrate. The oxide with calcium carbide structure preferably contains $CaO_2$ and one selected from the group consisting of $BaO_2$ and $SrO_2$.

A group III–V type nitride semiconductor device according to another embodiment of the present invention is characterized in that it includes a substrate containing an oxide having rock salt structure, and a nitride semiconductor layer epitaxially grown on a crystal plane of the substrate, and that the oxide contains one selected from the group consisting of CoO, MgO, MnO, NbO, NiO, TaO, TiO and VO and one selected from the group consisting of AmO, BaO, CaO, CdO, EuO, NpO, PaO, PuO, SmO, SrO, UO, YbO and ZrO.

A group III–V type nitride semiconductor device according to still another embodiment of the present invention is characterized in that it includes a substrate containing an oxide having spinel structure, and a nitride semiconductor layer epitaxially grown on the substrate, and that the oxide having spinel structure is formed of one selected from the group consisting of $Na_2MO_xW_{1-x}O_4$ ($0 \leq x \leq 1$) $MgIn_2O_4$ and $Mn_2SnO_4$. The oxide having spinel structure may contain $CdIn_2O_4$ and one selected from the group consisting of $CdCr_2O_4$, $CdFe_2O_4$, $CdGa_2O_4$ and $CdMn_2O_4$.

A group III–V type nitride semiconductor device according to still another embodiment of the present invention is characterized in that it includes a substrate containing an oxide having a crystal structure of $NaFeO_2$(II) type, and a nitride semiconductor layer epitaxially grown on the substrate, and that the oxide having a crystal structure of $NaFeO_2$(II) type is $Li_xNa_{1-x}GaO_2$ ($0 \leq x \leq 1$).

A group III–V type nitride semiconductor device according to still another embodiment of the present invention is characterized in that it includes a substrate containing an oxide having a crystal structure of LiAlO$_2$(I) type, and a nitride semiconductor layer epitaxially grown on the substrate, and that the oxide having a crystal structure of LiAlO$_2$(I) type is Li$_x$Na$_{1-x}$AlO$_2$ (0≦x≦1).

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

The first embodiment employs a substrate formed of an oxide with rutile structure. The substrate can be fabricated by e.g. zone melting method or Czochralski method.

Figure 1:
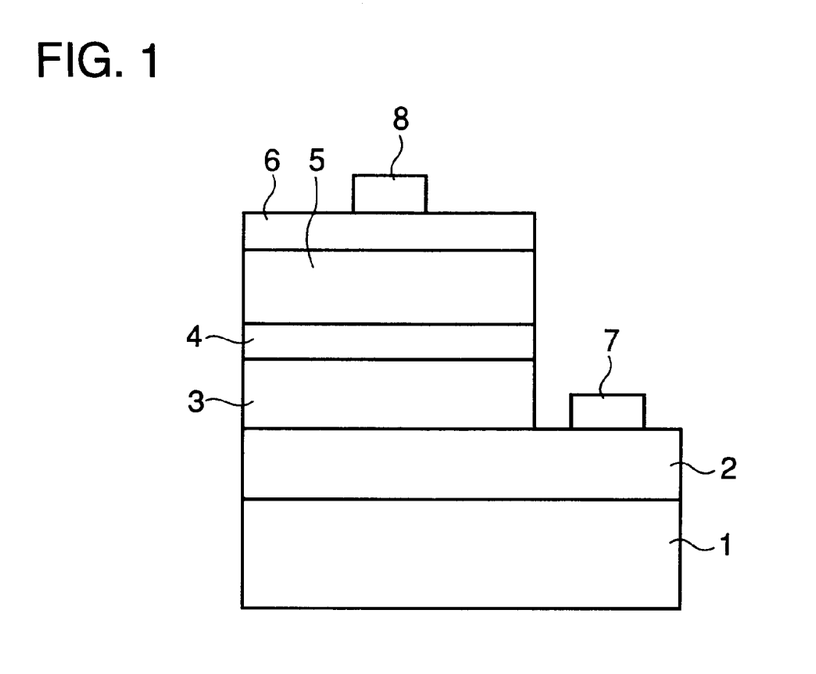
FIG. 1 is a schematic cross section of a nitride semiconductor laser device formed on a CrNbO$_2$ substrate.

FIG. 1 is a schematic cross section of a blue laser device formed on a (001) surface of a Cr$_{0.32}$Nb$_{0.68}$O$_2$ substrate. Successively grown in the laser device on a Cr$_{0.32}$Nb$_{0.68}$O$_2$ substrate 1 are an n-type GaN contact layer 2 (layer thickness: 0.1 μm, carrier concentration: 5×10$^{18}$ cm$^{-3}$), an n-type Al$_{0.2}$Ga$_{0.8}$N barrier layer 3 (layer thickness: 1.0 μm, carrier concentration: 5×10$^{17}$ cm$^{-3}$), an i-type Ga$_{0.9}$In$_{0.1}$N active layer 4 (layer thickness: 5 nm), a p-type Al$_{0.2}$Ga$_{0.8}$N barrier layer 5 (layer thickness: 0.8 μm, carrier concentration: 5×10$^{17}$ cm$^{-3}$) and a p-type GaN contact layer 6 (layer thickness: 0.1 μm, carrier concentration: 2×10$^{18}$ cm$^{-3}$) by the MOCVD method. The laser device is also provided with an n-type electrode 7 and a p-type electrode 8.

The blue laser device shown in FIG. 1 is fabricated using the cleavage of the Cr$_{0.32}$Nb$_{0.68}$O$_2$ substrate and is cleaved to have a cavity length of 1 mm. N-type electrode 7 is formed on n-type GaN contact layer 2 partially exposed by reactive ion beam etching (RIBE). P-type electrode 8 is adapted to have a stripe width of 10 μm.

Figure 2:
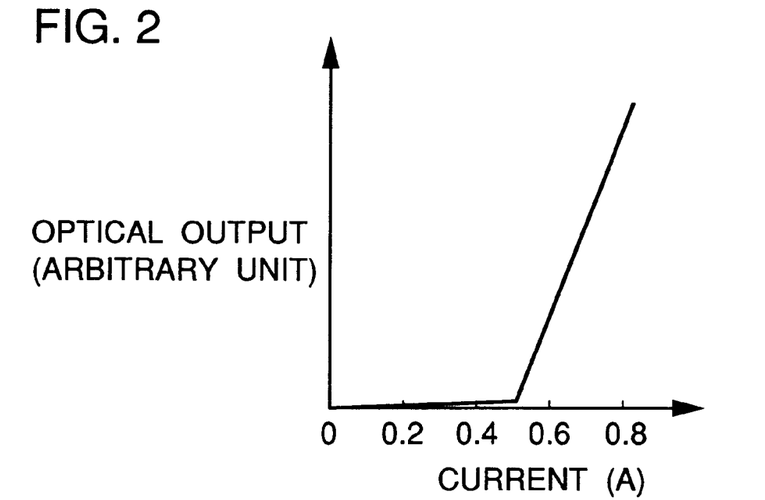
FIG. 2 is a graph representing a relation between the current and optical output in the laser device shown in FIG. 1.

FIG. 2 is a graph representing a relation between current and optical output when the laser device shown in FIG. 1 is excited at a pulse width of 1 μsec and a pulse period of 1 msec. More specifically, the horizontal axis represents current (A) and the vertical axis represents optical output (in an arbitrary unit) in the graph of FIG. 2. As can be seen from FIG. 2, the threshold current of the laser device of FIG. 1 is approximately 0.5 A, which is approximately half the threshold voltage of conventional laser devices with a MgAl$_2$O$_4$ substrate. This is believed to be attributed to the improvement in crystal quality of group III–V type nitride semiconductor layer included in the laser device shown in FIG. 1.

In using a (001) plane of a Cr$_x$Nb$_{1-x}$O$_2$ substrate, the composition ratio between Cr and Nb can be appropriately adjusted to obtain a lattice mismatch of 0% with respect to GaN in principle and hence a nitride semiconductor layer having a better crystal quality than in using conventional substrates. Furthermore, a GaN layer grown on a (001) plane of a Cr$_x$Nb$_{1-x}$O$_2$ substrate has zincblende structure which reflects the rutile structure of the substrate. This means that the substrate used is not limited to a Cr$_x$Nb$_{1-x}$O$_2$ substrate and may be a substrate of an oxide containing at least one selected from the group consisting of CrO$_2$, GeO$_2$ and IrO$_2$ and at least one selected from the group consisting of MoO$_2$, NbO$_2$, OsO$_2$, RuO$_2$, TiO$_2$ and WO$_2$. Table 3 indicates lattice constants in such oxides and GaN.

TABLE 3

| Compound | Lattice Constant (Å) |
| --- | --- |
| CrO$_2$ | 4.41 |
| GeO$_2$ | 4.395 |
| α-MnO$_2$ | 4.395 |
| IrO$_2$ | 4.49 |

TABLE 3-continued

| Compound | Lattice Constant (Å) |
| --- | --- |
| (cubic-GaN) | (4.497) |
| $MoO_2$ | 4.86 |
| $NbO_2$ | 4.77 |
| $OsO_2$ | 4.51 |
| $RuO_2$ | 4.51 |
| $TiO_2$ | 4.593 |
| $WO_2$ | 4.86 |

As can be seen from Table 3, at least one selected from $CrO_2$, $GeO_2$ and $IrO_2$ smaller in lattice constant than GaN and at least one selected from $MoO_2$, $NbO_2$, $OsO_2$, $RuO_2$, $TiO_2$ and $WO_2$ larger in lattice constant than GaN or AlGaN can be appropriately combined to obtain an oxide used as a substrate so that the lattice constant of the substrate is approximately equal to that of GaN.

Second Embodiment

The second embodiment employs a substrate formed of an oxide having calcium carbide structure. The substrate can be fabricated by zone melting method or Czochralski method.

Figure 3:
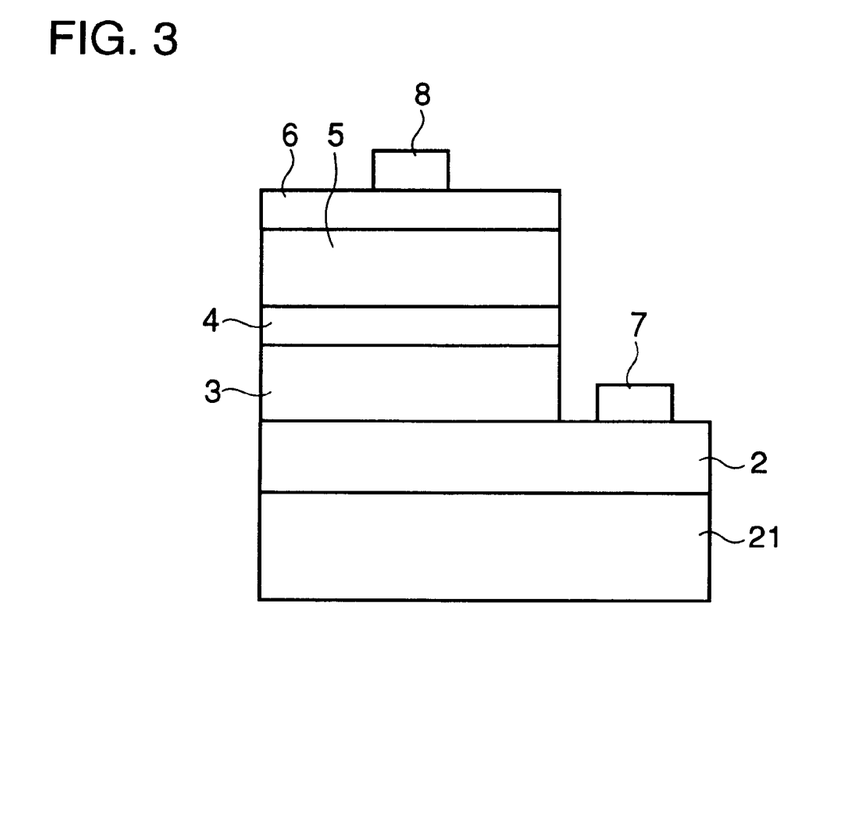
FIG. 3 is a cross section of a nitride semiconductor laser device formed on a CaBaO$_2$ substrate.

FIG. 3 is a cross section of a blue laser device formed on a (001) plane of a $Ca_{0.49}Ba_{0.51}O_2$ substrate. Grown in the laser device on a $Ca_{0.49}Ba_{0.51}O_2$ substrate 21 successively are an n-type GaN contact layer 2 (layer thickness: 0.1 μm, carrier concentration: $5\times10^{18}$ $cm^{-3}$), an n-type $Al_{0.2}Ga_{0.8}N$ barrier layer 3 (layer thickness: 1.0 μm, carrier concentration: $5\times10^{17}$ $cm^{-3}$), an i-type $Ga_{0.9}In_{0.1}N$ active layer 4 (layer thickness: 5 nm), a p-type $Al_{0.2}Ga_{0.8}N$ barrier layer 5 (layer thickness: 0.8 μm, carrier concentration: $5\times10^{17}$ $cm^{-3}$) and a p-type GaN contact layer 6 (layer thickness: 0.1 μm, carrier concentration: $2\times10^{18}$ $cm^{-3}$) by the MOCVD method. The laser device is also provided with n- and p-type electrodes 7 and 8.

The laser device shown in FIG. 3 is fabricated by a method similar to that in the first embodiment and is similar in dimensions and shape to the first embodiment.

Figure 4:
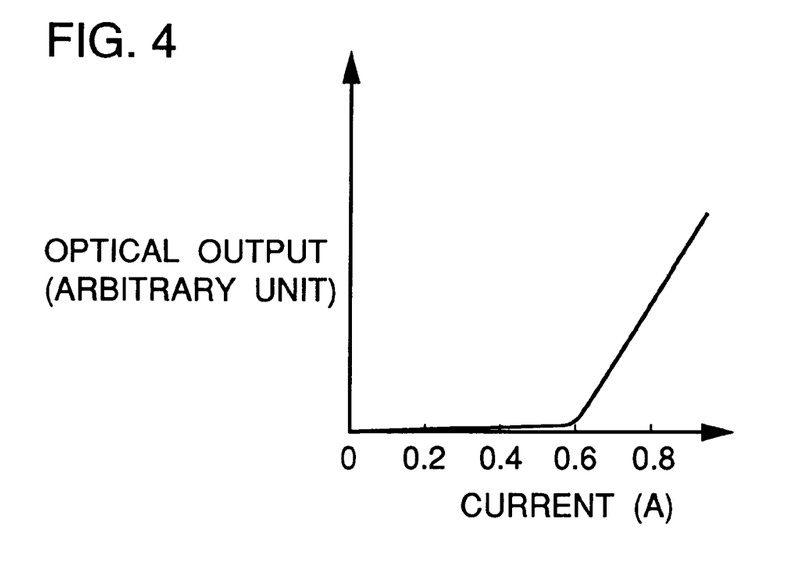
FIG. 4 is a graph representing a relation between the current and optical output in the laser device shown in FIG. 3.

FIG. 4 represents a relation between current and optical output when the laser device shown in FIG. 3 is excited at a pulse width of 1 μsec and a pulse period of 1 msec. The threshold current of the laser device shown in FIG. 3 is approximately 0.6 A, which is approximately half the threshold current of conventional laser devices. This is believed to be attributed to the improvement in crystal quality of group III–V type nitride semiconductor layer.

In using a (001) plane of a $Ca_xBa_{1-x}O_2$ substrate, the composition ratio between Ca and Ba can be appropriately adjusted to obtain a lattice mismatch of 0% with respect to GaN and hence a nitride semiconductor layer with a better crystal quality than in using conventional substrates. Furthermore, a GaN layer grown on the (001) plane of $Ca_xBa_{1-x}O_2$ substrate has zincblende structure which reflects the calcium carbide structure of the substrate. This means that the substrate used is not limited to a $Ca_xBa_{1-x}O_2$ and may be a substrate of an oxide containing $CaO_2$ and at least one selected from the group consisting of $BaO_2$ and $SrO_2$. Table 4 indicates the lattice constants of these oxides together with that of GaN.

TABLE 4

| Compound | Lattice Constant (Å) |
| --- | --- |
| $CaO_2$ | 3.54 |
| (cubic-GaN) | (4.497) |
| $BaO_2$ | 5.384 |
| $SrO_2$ | 5.03 |

As can be seen from Table 4, $CaO_2$ smaller in lattice constant than GaN and at least one of $BaO_2$ and $SrO_2$ larger in lattice constant than GaN can be appropriately combined to render the lattice constant of the substrate approximately equal to that of GaN.

Third Embodiment

The third embodiment employs a substrate formed of an oxide having rock salt structure. Such a substrate can be fabricated by zone melting method or Czochralski method.

Figure 5:
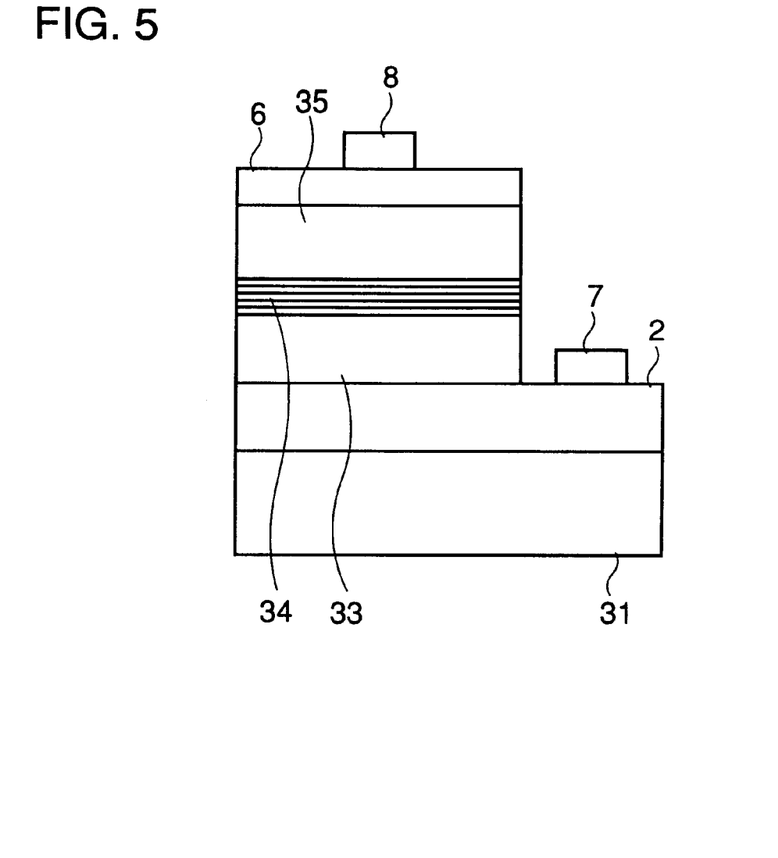
FIG. 5 is a cross section of a nitride semiconductor laser device formed on a MgYbO substrate.

FIG. 5 is a cross section of a blue laser device formed on a (111) plane of a $Mg_{0.57}Yb_{0.43}O$ substrate. Grown in the laser device on a $Mg_{0.57}Yb_{0.43}O$ substrate successively are an n-type GaN contact layer 2 (layer thickness: 0.1 μm, carrier concentration: $5\times10^{18}$ $cm^{-3}$), an n-type $Al_{0.1}Ga_{0.9}N$ barrier layer 33 (layer thickness: 1.0 μm, carrier concentration: $5\times10^{17}$ $cm^{-3}$), an i-type $Ga_{0.95}In_{0.05}N/Ga_{0.8}In_{0.2}N$ triple quantum well active layer 34 (layer thickness: 5 nm/10 nm), a p-type $Al_{0.1}Ga_{0.9}N$ barrier layer 35 (layer thickness: 0.8 μm, carrier concentration: $5\times10^{17}$ $cm^{-3}$) and a p-type GaN contact layer 6 (layer thickness: 0.1 μm, carrier concentration: $2\times10^{18}$ $cm^{-3}$) by the MOCVD method. The laser device also includes n- and p-type electrodes 7 and 8.

The laser device shown in FIG. 5 is fabricated in a method similar to that in the first embodiment and is similar in dimensions and shape to the first embodiment.

Figure 6:
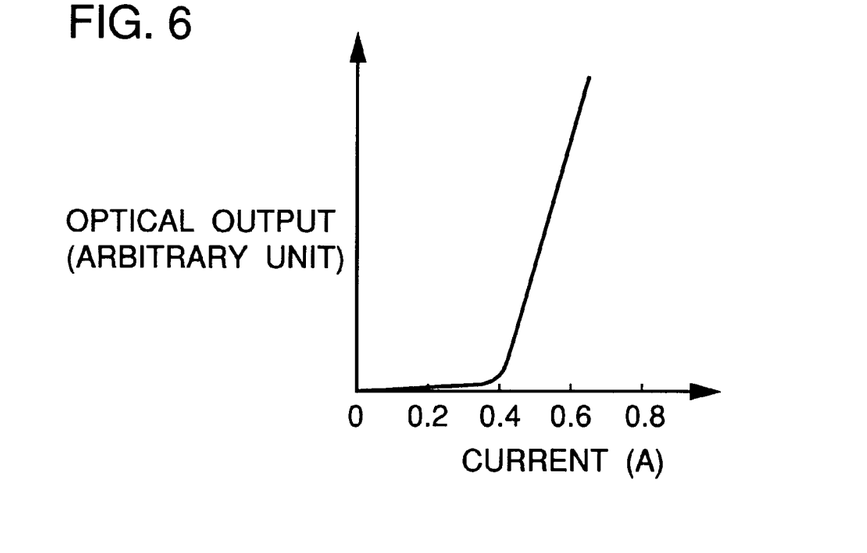
FIG. 6 is a graph representing a relation between the current and optical output in the laser device shown in FIG. 5.

FIG. 6 represents a relation between current and optical output when the laser device shown in FIG. 5 is excited at a pulse width of 1 μsec and a pulse period of 1 msec. As shown in FIG. 6, the threshold current of the laser device shown in FIG. 5 is approximately 0.4 A and is thus found to be significantly decreased as compared with conventional laser devices. This is believed to be attributed to the improvement in crystal quality of group III–V type nitride semiconductor layer.

In using a (111) plane of a $Mg_xYb_{1-x}O$ substrate, the composition ratio between Mg and Yb can be appropriately adjusted to obtain a lattice mismatch of 0% with respect to GaN in principle and hence a nitride semiconductor layer having a better crystal quality than in using conventional substrates. Furthermore, a GaN layer grown on the (111) plane of $Mg_xYb_{1-x}O$ substrate has wurtzite structure which reflects rock salt structure of the substrate. This means that the substrate used is not limited to a $Mg_xYb_{1-x}O$ substrate and may be a substrate of an oxide by appropriate combination of at least one selected from the group consisting of CoO, MgO, MnO, NbO, NiO, TaO, TiO and VO and at least one selected from the group consisting of AmO, BaO, CaO, CdO, EuO, NpO, PaO, PuO, SmO, SrO, UO, YbO and ZrO. Table 5 indicates the lattice constants of these oxides together with that of GaN.

TABLE 5

| Compound | Lattice Constant on (111) plane (Å) |
| --- | --- |
| CoO | 3.017 |
| MgO | 2.978 |
| MnO | 3.143 |
| NbO | 2.977 |
| NiO | 2.948 |
| TaO | 2.984–3.139 |
| TiO | 2.953 |
| VO | 2.872 |
| (hex-GaN) | (3.18) |
| AmO | 3.571 |
| BaO | 3.905 |
| CaO | 3.402 |
| CdO | 3.320 |
| EuO | 3.635 |
| NpO | 3.543 |
| PaO | 3.508 |
| PuO | 3.507 |
| SmO | 3.527 |
| SrO | 3.649 |
| UO | 3.479 |
| YbO | 3.437 |
| ZrO | 3.267 |

As can be seen from Table 5, at least one selected from the group consisting of CoO, MgO, NbO, NiO, TaO, TiO and VO smaller in lattice constant than GaN or AlGaN and at least one selected from the group consisting of AmO, BaO, CaO, CdO, EuO, NpO, PaO, PuO, SmO, SrO, UO, YbO and ZrO larger in lattice constant than GaN or AlGaN can be appropriately combined to obtain an oxide substrate so that the lattice constant of the substrate is approximately equal to that of GaN or AlGaN.

For a substrate with rock salt structure, a nitride semiconductor layer is preferably grown on a (111) plane thereof. The other crystal planes of the substrate is not adapted with respect to the crystal structure of the nitride semiconductor layer and thus is not suitable for obtaining a good single-crystal nitride semiconductor layer.

Fourth Embodiment

The fourth embodiment employs a substrate formed of an oxide with spinel structure. The substrate can be fabricated by zone melting method or Czochralski method.

Figure 7:
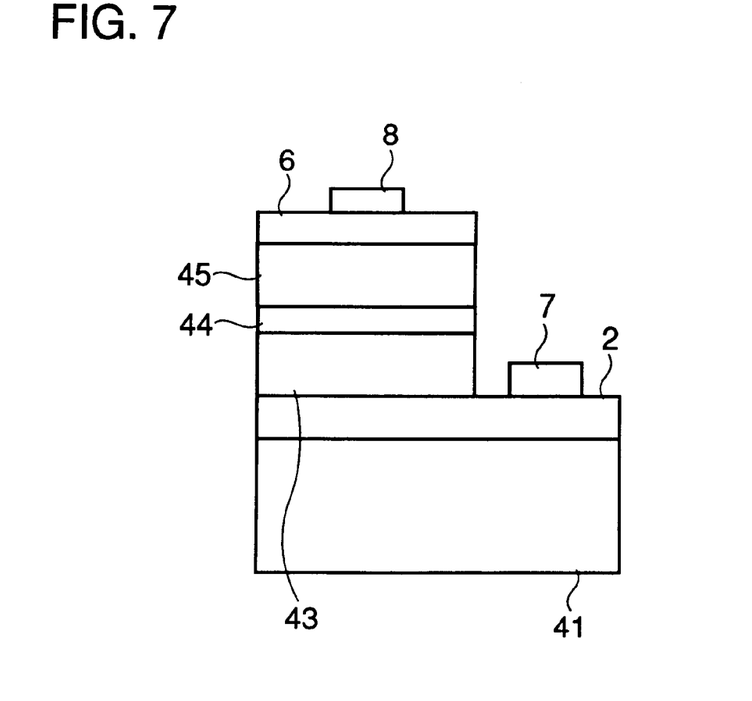
FIG. 7 is a cross section of a nitride semiconductor laser device formed on a Na$_2$MoO$_4$ substrate.
Figure 9:
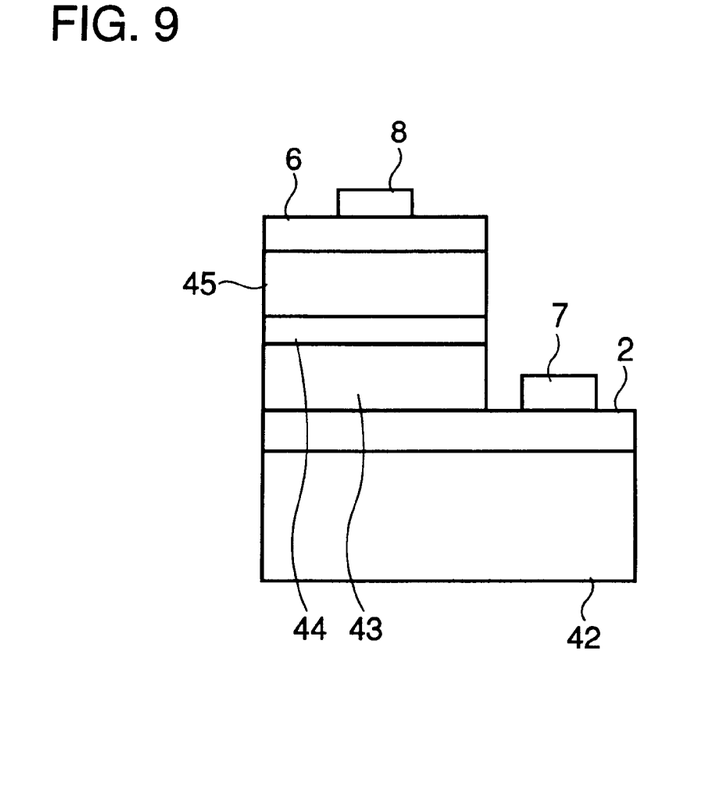
FIG. 9 is a cross section of a nitride semiconductor laser device formed on a Na$_2$WO$_4$ substrate.

FIGS. 7 and 9 are cross sections of blue laser devices formed on a (100) plane of a $Na_2MoO_4$ substrate 41 and a (111) plane of a $Na_2WO_4$ substrate 42. Grown in these laser devices on each of the (100) plane of $Na_2MoO_4$ substrate 41 and the (111) plane of $Na_2WO_4$ substrate 42 successively are an n-type GaN contact layer 2 (layer thickness: 0.1 μm, carrier concentration: $5\times10^{18}$ cm$^{-3}$), an n-type GaN barrier layer 3 (layer thickness: 1.0 μm, carrier concentration: $5\times10^{17}$ cm$^{-3}$), an i-type $Ga_{0.7}In_{0.3}N$ active layer 44 (layer thickness: 5 nm), a p-type GaN barrier layer 45 (layer thickness: 0.8 μm, carrier concentration: $5\times10^{17}$ cm$^{-3}$) and a p-type GaN contact layer 6 (layer thickness: 0.1 μm, carrier concentration: $2\times10^{18}$ cm$^{-3}$) by the MOCVD method. The laser devices shown in FIGS. 7 and 9 are each provided with n- and p-type electrodes 7 and 8.

The laser devices shown in FIGS. 7 and 9 are each fabricated by a method similar to that employed in the first embodiment and are similar in dimensions and shape to the first embodiment.

Figure 8:
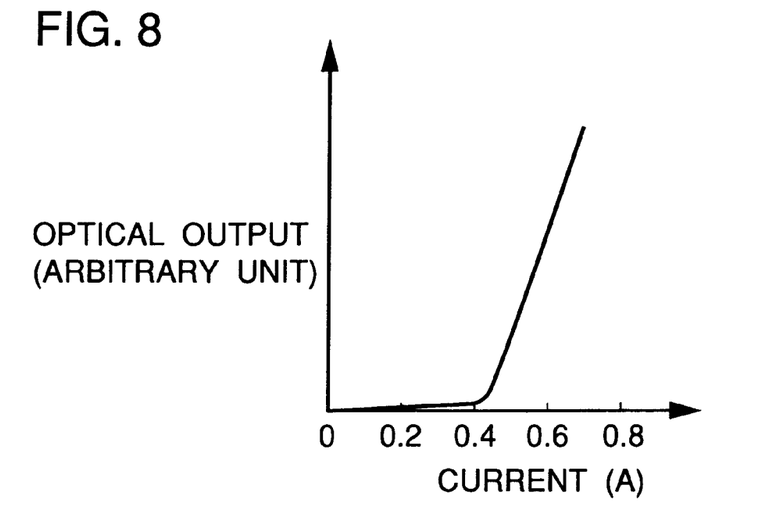
FIG. 8 is a graph representing a relation between the current and optical output in the laser device shown in FIG. 7.
Figure 10:
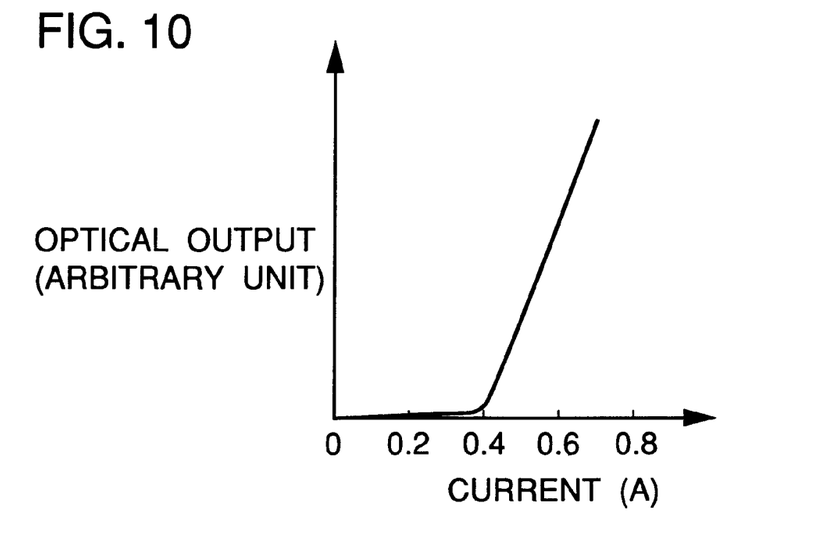
FIG. 10 is a graph representing a relation between the current and optical output in the laser device shown in FIG. 9.

FIGS. 8 and 10 respectively represents relations between current and optical output when the laser devices shown in FIGS. 7 and 9 are excited at a pulse width of 1 μsec and a pulse period of 1 msec. The threshold currents of the laser devices shown in FIGS. 7 and 9 are approximately 0.45 A, and 0.4 A, respectively, and thus are significantly reduced as compared with conventional laser devices. This is believed to be attributed to the improvement in crystal quality of group III–V type nitride semiconductor layer.

Table 6 indicates the lattice constants of $Na_2MoO_4$ and $Na_2WO_4$ as well as that of GaN. In Table 6, $a_{cubic}$ represents respective lattice constants on a (100) plane of substrates and a lattice constant of GaN corresponding thereto, and $a_{hex}$ represents respective lattice constants on a (111) plane of substrates and a lattice constant of GaN corresponding thereto.

TABLE 6

| Compound | $a_{cubic}$ | $a_{hex}$ |
| --- | --- | --- |
| $Na_2MoO_4$ | 4.495 | 3.178 |
| $Na_2WO_4$ | 4.495 | 3.178 |
| GaN | 4.497 | 3.18 |

As can be seen from Table 6, either the $Na_2MoO_4$ substrate or the $Na_2WO_4$ substrate has its lattice constant almost matched to that of GaN and use of these substrates allows GaN layers with better crystal qualities than in using conventional substrates. These GaN layers each have a crystal structure which reflects spinel structure of the substrate. The GaN layer grown on a (100) plane of the $Na_2MoO_4$ substrate having cubic structure has zincblende structure belonging to cubic system. The GaN layer grown on a (111) plane of the $Na_2WO_4$ substrate has a structure similar to side c of hexagonal crystal and thus has wurtzite structure belonging to hexagonal system. The difference in threshold current between the laser devices shown in FIGS. 7 and 9 is attributed to the difference in crystal structure of the nitride semiconductor layers in the devices. It should be noted that $Na_2Mo_xW_{1-x}O_4$ ($0 \leq x \leq 1$) can also be used as a substrate having spinel structure.

Fifth Embodiment

The fifth embodiment employs a substrate with spinel structure, as in the fourth embodiment.

Figure 11:
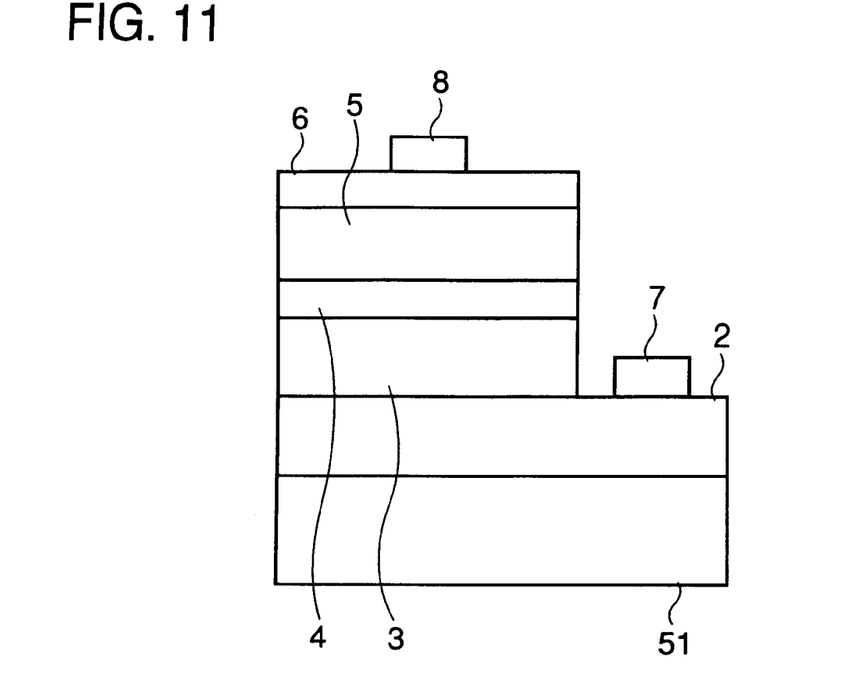
FIG. 11 is a cross section of a nitride semiconductor laser device formed on a CdGaInO$_4$ substrate.

FIG. 11 is a cross section of a blue laser device formed on a (111) plane of a $CdGa_{0.54}In_{1.46}O_4$ substrate. Grown in the laser device on a (111) plane of $CdGa_{0.54}In_{1.46}O_4$ substrate 51 successively are an n-type GaN contact layer 2 (layer thickness: 0.1 μm, carrier concentration: $5\times10^{18}$ cm$^{-3}$), an n-type $Al_{0.2}Ga_{0.8}N$ barrier layer 3 (layer thickness: 1.0 μm, carrier concentration: $5\times10^{17}$ cm$^{-3}$), an i-type $Ga_{0.9}In_{0.1}N$ active layer 4 (layer thickness: 5 nm), a p-type $Al_{0.2}Ga_{0.8}N$ barrier layer 5 (layer thickness: 0.8 μn, carrier concentration: $5\times10^{17}$ cm$^{-3}$) and a p-type GaN contact layer 6 (layer thickness: 0.1 μm, carrier concentration: $2\times10^{18}$ cm$^{-3}$) by the MOCVD method. The laser devices also includes n- and p-type electrodes 7 and 8.

The laser devices shown in FIG. 11 is fabricated by a method similar to that employed in the first embodiment and is similar in dimensions and shape to the first embodiment.

Figure 12:
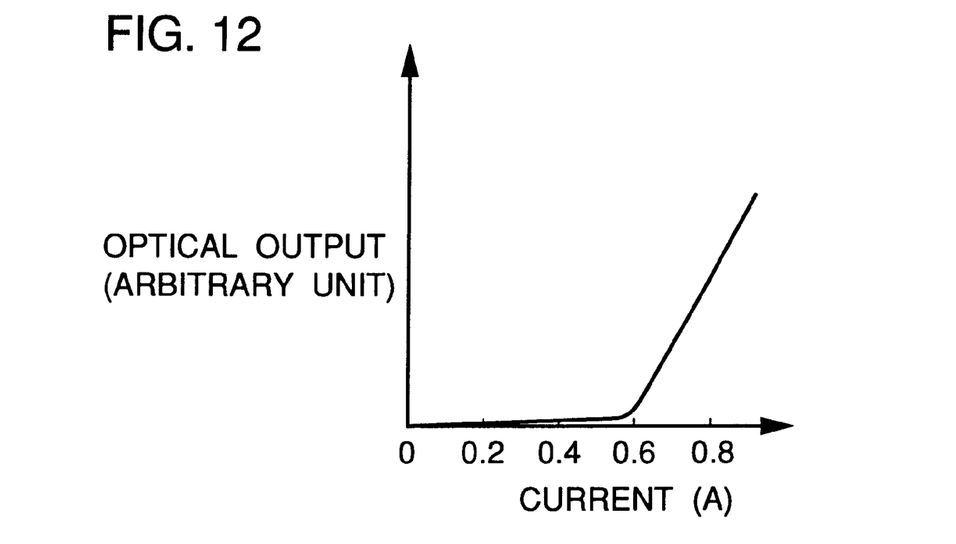
FIG. 12 is a graph representing a relation between the current and optical output in the laser device shown in FIG. 11.

FIG. 12 represents a relation between current and optical output when the laser device shown in FIG. 11 is excited at a pulse width of 1 μsec and a pulse period of 1 msec. As shown in FIG. 12, the threshold current of the laser device shown in FIG. 11 is approximately 0.6 A, which is approximately half that of conventional laser devices. This is believed to be attributed to the improvement in crystal quality of nitride semiconductor layer.

In using a $CdGa_xIn_{2-x}O_4$ substrate, the composition ratio between Ga and In can be appropriately adjusted to obtain a lattice mismatch of 0% with respect to GaN in principle and hence a nitride semiconductor layer with better crystal quality than in using conventional substrates. A nitride semiconductor layer of InGaN, GaN or AlGaN grown on a (111) plane of the $CdGa_xIn_{2-x}O_4$ substrate has wurtzite structure. This means that the substrate used is not limited to a $CdGa_xIn_{2-x}O_4$ substrate and can be a substrate formed of an oxide obtained by appropriately combining $CdIn_2O_4$ and at least one selected from the group consisting of $CdCr_2O_4$, $CdFe_2O_4$, $CdGa_2O_4$ and $CdMn_2O_4$. Table 7 indicates the lattice constants of these oxides as well as that of GaN.

TABLE 7

| Compound | $a_{cubic}$ | $a_{hex}$ |
| --- | --- | --- |
| $CdCr_2O_4$ | 4.284 | 3.029 |
| $CdFe_2O_4$ | 4.345 | 3.072 |
| $CdGa_2O_4$ | 4.195 | 2.966 |
| $CdMn_2O_4$ | 4.110 | 2.906 |
| (GaN) | 4.497 | 3.18 |
| $CdIn_2O_4$ | 4.584 | 3.241 |

As can be seen from Table 7, $CdIn_2O_4$ larger in lattice constant than GaN and at least one selected from the group consisting of $CdCr_2O_4$, $CdFe_2O_4$, $CdGa_2O_4$ and $CdMn_2O_4$ smaller in lattice constant than GaN can be appropriately combined to obtain a substrate so that the lattice constant of the substrate is almost equal to that of GaN.

Sixth Embodiment

The sixth embodiment also employs a substrate with spinel structure.

Figure 13:
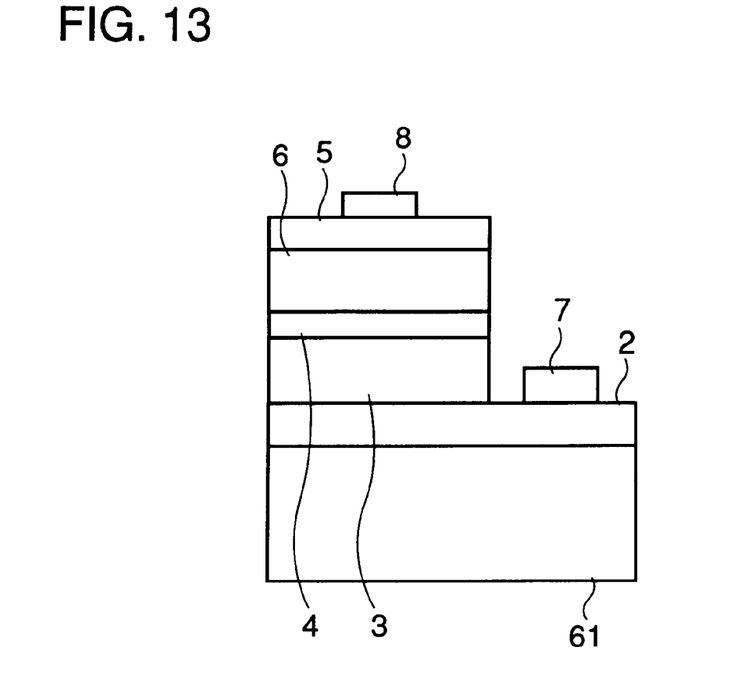
FIG. 13 is a cross section of a nitride semiconductor laser device formed on a MgIn$_2$O$_4$ substrate.
Figure 15:
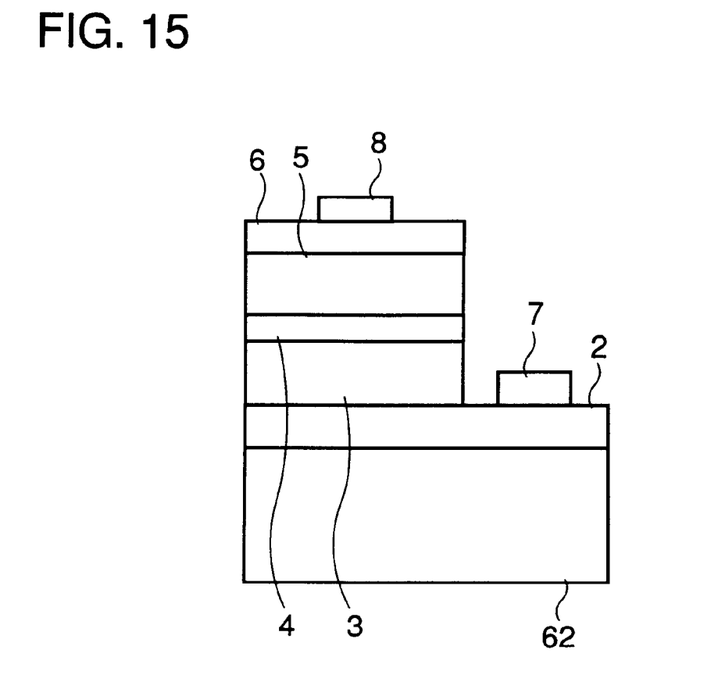
FIG. 15 is a cross section of a nitride semiconductor laser device formed on a Mn$_2$SnO$_4$ substrate.

FIGS. 13 and 15 are cross sections of blue laser devices formed on a (100) plane of a $MgIn_2O_4$ substrate and a (111) plane of a $Mn_2SnO_4$ substrate, respectively. Grown on each of a (100) plane of a $MgIn_2O_4$ substrate 61 and a (111) plane of a $Mn_2SnO_4$ substrate 62 successively are an n-type GaN contact layer 2 (layer thickness: 0.1 μm, carrier concentration: $5 \times 10^{18}$ cm$^{-3}$), an n-type $Al_{0.2}Ga_{0.8}N$ barrier layer 3 (layer thickness: 1.0 μm, carrier concentration: $5 \times 10^{17}$ cm$^3$), an i-type $Ga_{0.9}In_{0.1}N$ active layer 4 (layer thickness: 5 nm), a p-type $Al_{0.2}Ga_{0.8}N$ barrier layer 5 (layer thickness: 0.8 μm, carrier concentration: $5 \times 10^{17}$ cm$^{-3}$) and a p-type GaN contact layer 6 (layer thickness: 0.1 μm, carrier concentration: $5 \times 10^{18}$ cm$^{-3}$) by the MOCVD method. The laser devices each include n- and p-type electrodes 7 and 8.

The laser devices shown in FIGS. 13 and 15 are each fabricated by a method similar to that employed in the first embodiment and is similar in dimensions and shape to the first embodiment.

Figure 14:
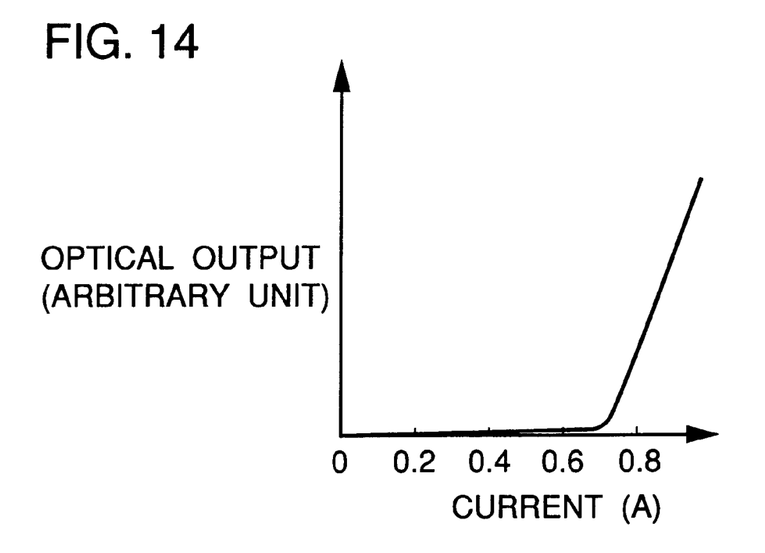
FIG. 14 is a graph representing a relation between the current and optical output in the laser device shown in FIG. 13.
Figure 16:
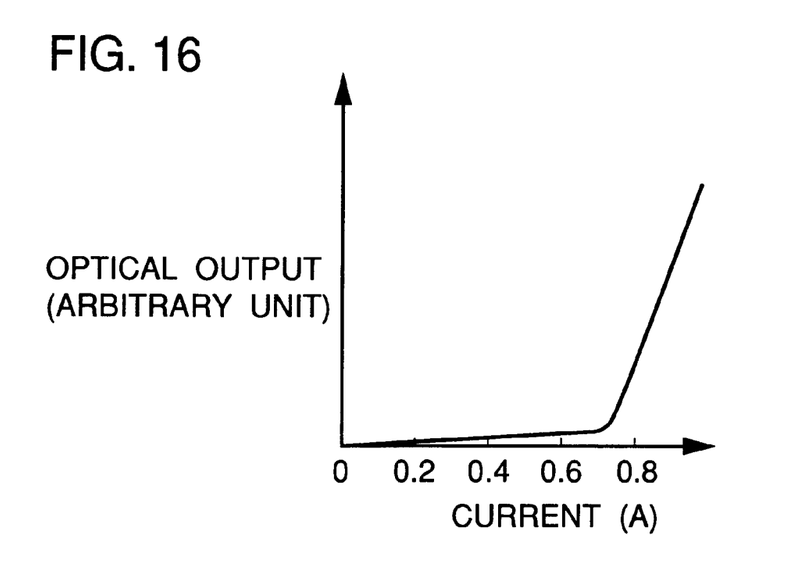
FIG. 16 is a graph representing a relation between the current and optical output in the laser device shown in FIG. 15.

FIGS. 14 and 16 represent relations between current and optical output when the laser devices shown in FIGS. 13 and 15 are excited at a pulse width of 1 μsec and a pulse period of 1 msec. As shown in FIGS. 14 and 16, the laser devices shown in FIGS. 13 and 15 are approximately 0.7 A and are thus reduced as compared with those of conventional laser devices. This is believed to be attributed to the improvement in crystal quality of nitride semiconductor layer included in the laser devices shown in FIGS. 13 and 15.

TABLE 8

| Compound | $a_{cubic}$ | $a_{hex}$ |
| --- | --- | --- |
| $MgIn_2O_4$ | 4.405 | 3.114 |
| $Mn_2SnO_4$ | 4.433 | 3.134 |
| GaN | 4.497 | 3.18 |

Table 8 indicates the lattice constants of $MgIn_2O_4$ and $Mn_2SnO_4$ as well as that of GaN. Since the lattice mismatches between the GaN layer and substrates are not sufficiently small in the sixth embodiment, as can be seen from Table 8, the reduction in threshold current is smaller than in the other embodiments.

It should be noted that a GaN layer grown on a (100) plane of a $MgIn_2O_4$ substrate has zincblende structure and a GaN layer grown on a (111) plane of a $Mn_2SnO_4$ substrate has wurtzite structure.

Seventh Embodiment

Figure 17:
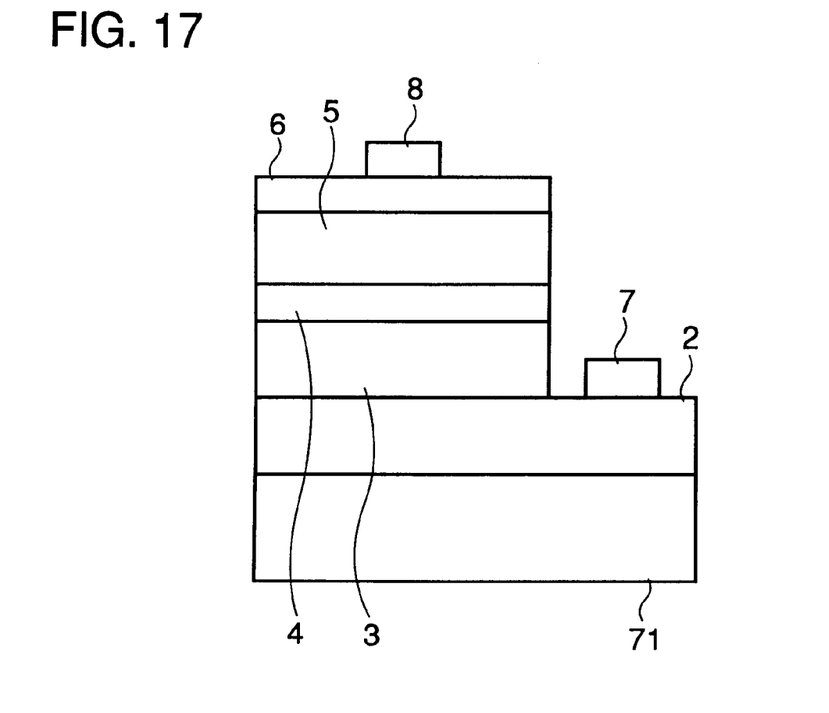
FIG. 17 is a cross section of a nitride semiconductor laser device formed on a LiNaGaO$_2$ substrate.

FIG. 17 is a cross section of a blue laser device formed on a (110) plane of a $Li_{0.5}Na_{0.5}GaO_2$ substrate. Grown in the laser device on a (110) plane of a $Li_{0.5}Na_{0.5}GaO_2$ substrate 71 successively are an n-type GaN contact layer 2 (layer thickness: 0.1 μm, carrier concentration: $5 \times 10^{18}$ cm$^{-3}$), an n-type $Al_{0.2}Ga_{0.8}N$ barrier layer 3 (layer thickness: 1.0 μm, carrier concentration: $5 \times 10^{17}$ cm$^{-3}$), an i-type $Ga_{0.9}In_{0.1}N$ active layer 4 (layer thickness: 5 nm), a p-type $Al_{0.2}Ga_{0.8}N$ barrier layer 5 (layer thickness: 0.8 μm, carrier concentration: $5 \times 10^{17}$ cm$^{-3}$) and a p-type GaN contact layer 6 (layer thickness: 0.1 μm, carrier concentration: $5 \times 10^{18}$ cm$^{-3}$), by the MBE method. The laser device also includes n- and p-type electrodes 7 and 8.

The laser device shown in FIG. 17 is also fabricated by a method similar to that employed in the first embodiment and is similar in dimensions and shape to the first embodiment.

Figure 18:
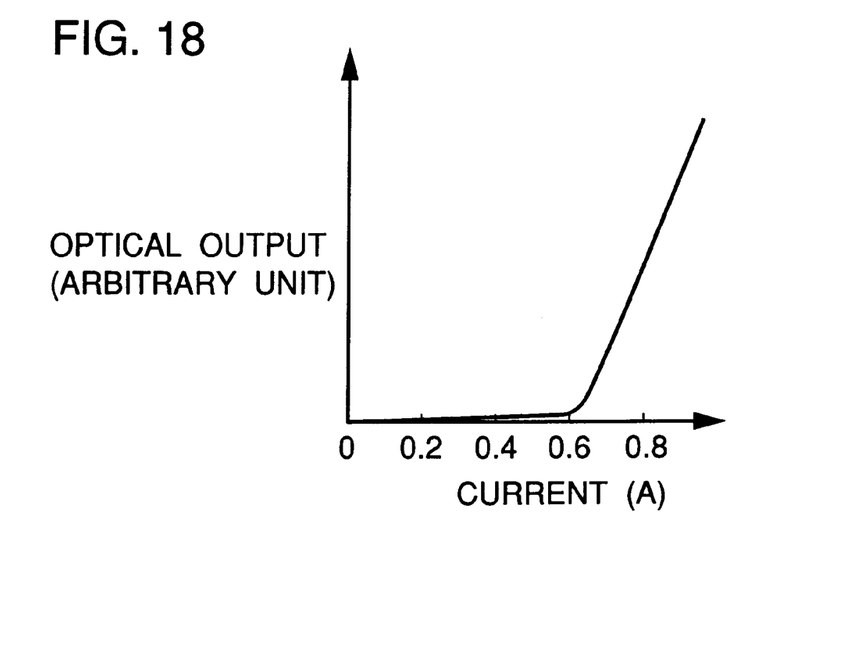
FIG. 18 is a graph representing a relation between the current and optical output in the laser device shown in FIG. 17.

FIG. 18 represents a relation between current and optical output when the laser device shown in FIG. 17 is excited at a pulse width of 1 μsec and a pulse period of 1 msec. As shown in FIG. 18, the threshold current of the laser device shown in FIG. 17 is approximately 0.6 A and is thus reduced as compared with those of conventional laser devices. This is believed to be attributed to the improvement in crystal quality of nitride semiconductor layer.

When a $LiGaO_2$ substrate is used, the lattice positions of oxygen atoms form a shape distorted from an equitriangle, as shown in FIG. 22. Since the distance between oxygen atoms bonded with Ga is approximately 3 Å and the distance between oxygen atoms bonded with Li is approximately 3.2 Å, as indicated in Table 2, the substrate is not matched in lattice to GaN. Accordingly, a GaN layer grown directly on such a substrate has a poor crystal quality. In order to lattice-match this substrate to $Al_{0.2}Ga_{0.8}N$ used as a clad layer, the distance between oxygen atoms bonded with Ga need be increased and the inventors have thus discovered use of the substrate according to the present embodiment in which Na is added to $LiGaO_2$ to increase the distance between oxygen atoms bonded with Ga.

Eighth Embodiment

Figure 19:
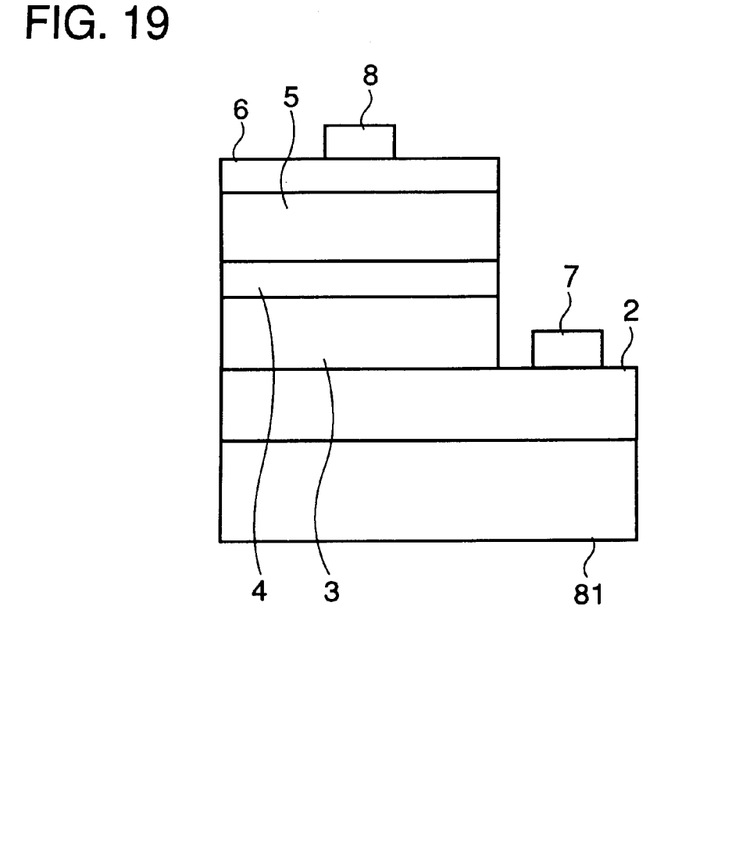
FIG. 19 is a cross section of a nitride semiconductor laser device formed on a LiNaAlO$_2$ substrate.

FIG. 19 is a cross section of a blue laser device formed on a (001) plane of a $Li_{0.3}Na_{0.7}AlO_2$ substrate. Grown in the laser device on a (001) plane of a $Li_{0.3}Na_{0.7}AlO_2$ substrate 81 successively are an n-type GaN contact layer 2 (layer thickness: 0.1 μm, carrier concentration: $5 \times 10^{18}$ cm$^{-3}$), an n-type $Al_{0.2}Ga_{0.8}N$ barrier layer 3 (layer thickness: 1.0 μm, carrier concentration: $5\times10^{17}$ cm$^{-3}$), an i-type $Ga_{0.9}In_{0.1}N$ active layer 4 (layer thickness: 5 nm), a p-type $Al_{0.2}Ga_{0.8}N$ barrier layer 5 (layer thickness: 0.8 μm, carrier concentration: $5\times10^{17}$ cm$^{-3}$) and a p-type GaN contact layer 6 (layer thickness: 0.1 μm, carrier concentration: $2\times10^{18}$ cm$^{-3}$) by the MBE method. The laser device also includes n- and p-type electrodes 7 and 8.

The laser device shown in FIG. 19 is also fabricated by a method similar to that employed in the first embodiment and is similar in dimensions and shape to the first embodiment.

Figure 20:
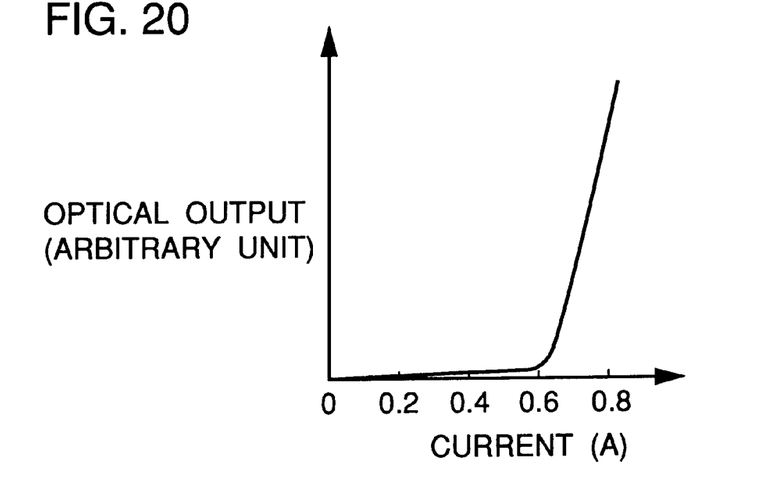
FIG. 20 is a graph representing a relation between the current and optical output in the laser device shown in FIG. 19.

FIG. 20 represents a relation between current and optical output when the laser device shown in FIG. 19 is excited at a pulse width of 1 μsec and a pulse period of 1 msec. As shown in FIG. 20, the threshold current of the laser device shown in FIG. 19 is approximately 0.6 A and is thus reduced as compared with those of conventional laser devices. This is believed to be attributed to the improvement in crystal quality of nitride semiconductor layer.

When a $LiAlO_2$ substrate is used, the lattice sites of oxygen form a shape distorted from an equitriangle, as shown in FIG. 21. Since the interatomic distance between oxygen bonded with Al is approximately 2.9 Å and the distance between oxygen atoms bonded with Li is approximately 3.2 Å, as indicated in Table 1, the substrate is not matched in lattice to GaN. Accordingly, a nitride semiconductor layer grown on such a substrate has a poor crystal quality. Particularly, in order to lattice-match the substrate to $Al_{0.2}Ga_{0.8}N$ used as a clad layer, the distance between oxygen atoms bonded with Al in the substrate need be increased and the inventors have thus discovered that a substrate in which the distance between oxygen atoms bonded with Al is increased by adding Na to $LiAlO_2$ can be used for epitaxial growth of nitride semiconductor layer.

Although the eighth embodiment describes that a nitride semiconductor layer of GaN type is grown on a substrate, a semiconductor layer of AlGaN type or InGaN type may be grown on the substrate.

By thus employing the substrates discovered by the Inventors, the lattice mismatch can be reduced with respect to a III–V type nitride semiconductor layer epitaxially grown thereon and the characteristics of a group III–V type nitride semiconductor device can be significantly improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A group III–V type nitride semiconductor device characterized in that it comprises:

a substrate containing an oxide having calcium carbide structure; and a nitride semiconductor layer epitaxially grown on said substrate.

2. The group III–V type nitride semiconductor device according to claim 1, characterized in that said oxide contains $CaO_2$ and at least one oxide selected from the group consisting of $BaO_2$ and $SrO_2$.

3. A group III–V type nitride semiconductor device comprising:

a substrate containing an oxide having rock salt structure; and a nitride semiconductor layer epitaxially grown on a (111) plane of said substrate; the device characterized in that said oxide contains at least one oxide selected from the group consisting of CoO, MgO, NbO, NiO, TaO, TiO, and VO and at least one oxide selected from the group consisting of AmO, BaO, CaO, CdO, EuO, NpO, PaO, PuO, SmO, SrO, UO, YbO and ZrO.

4. A group III–V type nitride semiconductor device comprising:

a substrate containing an oxide having spinel structure; and a nitride semiconductor layer epitaxially grown on said substrate; the device characterized in that said oxide is $Na_2Mo_xW_{1-x}O_4$ ($0 \leq x \leq 1$).

5. A group III–V type nitride semiconductor device comprising:

a substrate containing an oxide having calcium carbide structure; and a nitride semiconductor layer epitaxially grown on said substrate; the device characterized in that said oxide is $Ca_xBa_{1-x}O_2$ ($0 \leq x \leq 1$).

6. A group III–V type nitride semiconductor device comprising:

a substrate containing an oxide having calcium carbide structure; and a nitride semiconductor layer epitaxially grown on said substrate; the device characterized in that said oxide is $Mg_xYb_{1-x}O$ ($0 \leq x < 1$).

7. A group III–V type nitride semiconductor device comprising:

a substrate containing an oxide having wurtzite structure; and a nitride semiconductor layer epitaxially grown on said substrate; the device characterized in that said oxide is $Mn_2SnO_4$.

* * * * *